RING CIRCUIT

Filed Sept. 30, 1954

INVENTOR.
OLIN L. MAC SORLEY

BY P. E. Henninger

ATTORNEY

United States Patent Office 2,882,423
Patented Apr. 14, 1959

2,882,423

RING CIRCUIT

Olin L. MacSorley, Poughkeepsie, N.Y., assignor to International Business Machines Corporation, New York, N.Y., a corporation of New York Application September 30, 1954, Serial No. 459,388

8 Claims. (Cl. 307—88.5)

Figures 1, 2:
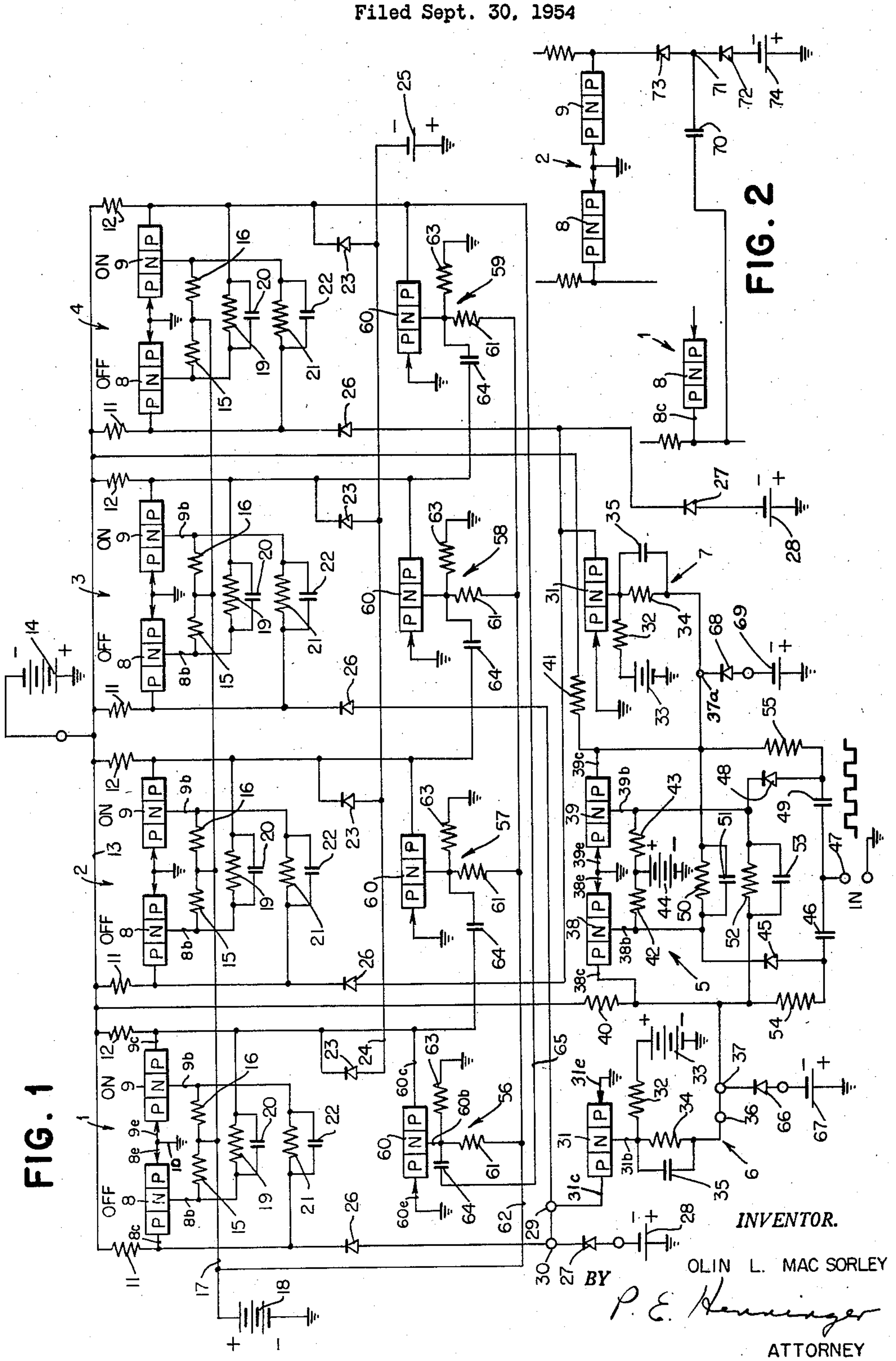

This invention relates to transistor ring circuits.

A ring circuit may be defined as a plurality of cascade connected stages, each stage being shiftable between an On condition and an Off condition. At any given time, all stages but one are Off. In a typical ring circuit, input signals are transmitted to all the stages in parallel, but affect only the one On stage, which, upon receipt of such a signal, turns Off and trips the next stage On. Alternatively, in a ring circuit of another type, such as the present one, input pulses are transmitted alternately first to all the odd numbered stages in parallel and then to all the even numbered stages in parallel.

Ring circuits are used for various purposes in connection with modern high speed computers. For example, they may be used as counting circuits to count the number of input pulses received. Alternatively, they are used as commutator circuits to establish an operating cycle which may be repeated as desired and which comprises a series of distinct intervals, which intervals are distinguished by the particular stage of the ring circuit which is then On.

In connection with such ring circuits, it is desirable to reduce the switching time between stages as much as possible. It is also desirable to simplify the circuits as much as possible.

An object of the invention is to provide a transistor ring circuit, including an improved and simplified driving circuit for transmitting impulses to the ring.

Another object is to provide an improved arrangement for coupling the several stages of the ring circuit so as to improve the switching time between stages.

The foregoing objects of the invention are attained, in the circuit described herein, by providing, for each stage of the ring circuit, two transistors having their output electrodes cross-coupled with their input electrodes so that when one transistor is On, the other is Off. Input signals are fed to the stages at the output electrode of one of the transistors. Said signals do not affect that particular transistor immediately, but they are transmitted through the cross-coupling to the input electrode of the other transistor, causing it to change its output states. This produces a signal at the output electrode of that transistor which is transferred through the cross-coupling means to the input electrode of the first transistor, causing it to switch between its two output states.

This invention is illustrated as applied to a ring circuit which has the odd numbered stages driven by one signal source and the even numbered stages driven by another alternately transmitting signal source. In accordance with the present invention, these input signal sources are coupled to the collector electrodes of the Off transistors of each stage through diodes. The load resistors for these Off transistors of each stage thereby serve as the load resistor for the inverter drive circuit. However, since only one stage can be On at a time, only one load resistor effectively loads the inverter circuit, regardless of the number of stages.

Means are provided for utilizing the input signal coupling diodes additionally to couple a clamping circuit comprising another diode and a battery.

Two methods of coupling the successive stages of the ring are illustrated. One coupling method includes an interstage coupling inverter connected between the On transistor output electrode of the preceding stage and the On transistor input electrode of the following stage. An alternative arrangement omits the interstage coupling inverter and connects the collector electrode of the Off transistor of each stage through a capacitor and a diode in series to the collector electrode of the On transistor of the following stage.

Other objects and advantages of the invention will become apparent from a consideration of the following specification and claims, taken together with the accompanying drawings.

In the drawings:

Fig. 1 is a wiring diagram of a transistor ring circuit, comprising the invention; and Fig. 2 is a fragmentary wiring diagram illustrating a modification of the circuit of Fig. 1.

FIG. 1

This figure illustrates a ring circuit embodying the invention. The circuit illustrated includes four stages generally indicated respectively by the reference numerals 1, 2, 3 and 4, each of the type disclosed and claimed in copending application Serial No. 459,381, filed September 30, 1954, by Robert A. Henle, Raymond W. Emery, George D. Bruce and Olin L. MacSorley. The four stages of the ring circuit are driven by an input trigger circuit generally indicated by the reference numeral 5. The trigger circuit 5 drives a first inverter circuit 6, which in turn drives the odd numbered stages of the ring. The trigger circuit 5 also drives an inverter circuit 7 which in turn drives the even numbered stages of the ring.

The inverter circuits 6 and 7 are turned On alternately, so that signals are supplied alternately to the odd and even numbered stages of the ring. This is in accordance with the conventional operation of a Leslie type ring circuit, as disclosed in pages 1030–4 of the August 1948 issue of the Proceedings of the Institute of Radio Engineers.

Each of the four stages comprises circuit elements which respectively correspond to similar elements in the other stages. Only one of the stages will, therefore, be described in detail. Similar reference numerals will be used for the corresponding circuit elements in the other stages.

The stage 1 includes a transistor 8, hereinafter referred to as the Off transistor, and a transistor 9, hereinafter referred to as the On transistor. The transistors 8 and 9 are provided with emitter electrodes **8*e* and 9*e*, base electrodes 8*b* and 9*b* and collector electrodes 8*c* and 9*c***.

The emitter electrodes **8*e* and 9*e* are connected to ground at 10. The collector electrodes 8*c* and 9*c* are connected respectively through load resistors 11 and 12 to a wire 13 and thence through a battery 14 to ground. The base electrodes 8*b* and 9*b* are connected respectively through resistors 15 and 16 and thence through a wire 17 and a biasing battery 18** to ground.

A cross-coupling connection is provided between base electrode **8*b* and collector electrode 9*c*, said cross connection comprising a resistor 19 and a parallel capacitor 20. A similar cross-coupling connection is provided between base electrode 9*b* and collector electrode 8*c*, said connection comprising a resistor 21 and a parallel capacitor 22**.

Clamping means for the collector electrode **9*c* is provided including a branch circuit which may be traced from collector 9*c* through a diode 23, a wire 24, and a battery 25** to ground.

Clamping means is provided for collector electrode 8c including a branch circuit which may be traced from collector 8c through two diodes 26 and 27 and a battery 28 to ground.

A signal input connection is provided for the stage 1, including the inverter circuit 6, which has an output terminal 29 connected to an input terminal 30 of stage 1 located between the diodes 26 and 27. The inverter circuit 6 is a novel modification of the general type disclosed in the copending application of George D. Bruce and Robert A. Henle, Serial No. 459,322, filed September 30, 1954. This inverter circuit comprises a PNP junction transistor 31 having an emitter electrode 31e, a base electrode 31b and a collector electrode 31c. The emitter electrode 31e is connected to ground. The collector electrode 31c is connected to output terminal 29.

The base electrode 31b is connected through a resistor 32 and a biasing battery 33 to ground. Base electrode 31b is also connected through a resistor 34 and a parallel capacitor 35 to an input terminal 36, which is connected to an output terminal 37 of the trigger circuit 5.

The inverter circuit 7 has circuit elements which correspond generally to those of the inverter circuit 6 and which have been given the same reference numerals. The inverter 7 will therefore not be described in detail.

The trigger circuit 5 is of the type described and claimed in the above-mentioned application of Henle et al., Serial No. 459,381, filed September 30, 1954, and it will be described only briefly here. It comprises two PNP junction transistors 38 and 39 having emitter electrodes 38e and 39e connected to ground, base electrodes 38b and 39b and collector electrodes 38c and 39c.

Collector electrodes 38c and 39c are connected through load resistors 40 and 41 respectively, to the wire 13 and thence through battery 14 to ground. Base electrodes 38b and 39b are connected respectively through resistors 42 and 43 to a biasing battery 44. Base electrode 38b is connected through an input gate including a diode 45 and a capacitor 46 in series to an input terminal 47. A resistor 54 is connected between the common junction of diode 45 and capacitor 46 and the collector electrode 38c. Base electrode 39b is connected through an input gate including a diode 48 and a capacitor 49 in series to an input terminal 47. A resistor 55 is connected between the common junction of diode 48 and capacitor 49 to collector electrode 39c.

Base electrode 38b is cross-coupled to collector electrode 39c through a resistor 50 and a parallel capacitor 51. Base electrode 39b is similarly cross-coupled to collector electrode 38c through a resistor 52 and a capacitor 53. A clamp circuit for collector 38c includes a diode 66 and a battery 67 connected between collector 38c and ground. A similar clamp circuit for collector 39c includes a diode 68 and a battery 69.

Each stage of the ring circuit is coupled to the next succeeding stage through an inverter, illustrated as being of the type described in the above-mentioned Bruce et al. application, Serial No. 459,322. The four inverters for coupling the four stages of the ring shown are respectively indicated generally by the reference numerals 56, 57, 58 and 59. Each of the four interstage coupling inverters corresponds to the others, and the circuit elements of all these inverters have, therefore, been given corresponding reference numerals. Only one of the four circuits will be described in detail.

The interstage coupling inverter 56 comprises a PNP junction transistor 60 having an emitter electrode 60e, a base electrode 60b and a collector electrode 60c. The emitter electrode 60e is connected to ground. The collector electrode 60c is connected to the collector electrode 9c of the transistor 9 in stage 1. Base electrode 60b is connected through a resistor 61, a wire 62 and the biasing battery 18 to ground. Base electrode 60b is also connected through a resistor 63 to ground, and through a coupling capacitor 64 and a wire 65 to the collector electrode 9c of stage 4.

The interstage coupling inverter 56 couples stage 4 to stage 1. Similarly, interstage coupling inverter 57 couples stage 1 to stage 2, interstage coupling inverter 58 couples stage 2 to stage 3 and interstage coupling inverter 59 couples stage 3 to stage 4.

OPERATION OF FIG. 1

Only one of the stages of the ring is in its On condition at any time, all of the others being Off. A stage is said to be in the On condition when its transistor 9 is On, and to be in the Off condition when the transistor 9 is Off. The cross-coupling connections between the collector electrodes and base electrodes of the transistors 8 and 9 insure that when transistor 9 is On, transistor 8 is Off and vice versa. Only the one stage of the ring which is On responds to input signals. Upon the receipt of an input signal, that one stage of the ring circuit which is On switches Off and in so doing transmits a signal to the next stage of the ring circuit which is effective to turn the latter stage On.

The trigger circuit 5 operates in the manner explained in detail in the copending application Serial No. 459,381, previously mentioned. For the purposes of the present invention, it is considered sufficient to state that a square wave signal generator having suitable output characteristics is connected between input terminal 47 and ground. A typical generator may have a no-signal output potential of −8 volts and a signal potential of 0 volts. One of the transistors 38 and 39 is always On, the other being Off. The two transistors are switched back and forth between their two states by successive signals at the input terminal 47. The output signals at the terminals 37 and 37a may have the same potential swing as the input signals, namely, from −8 to 0 volts, but the potentials at terminals 37 and 37a are opposite in phase. That is to say, when terminal 37 is at 0 volts, terminal 37a is at −8 volts, and vice versa.

The inverters 6 and 7 operate in the manner described in the copending application of Bruce and Henle, Serial No. 459,322, previously mentioned. Taking inverter 6, for example, transistor 31 is biased Off by the battery 33. When there is no signal (−8 volts) at input terminal 36 of the inverter 6, that negative potential overcomes the bias through battery 33 and transistor 31 is conductive, its output terminal 29 then being at its most positive value (0 volts). When a signal is received at input terminal 36, i.e., when it comes to 0 volts, then the battery 33 is effective to cut the transistor 31 Off and output terminal 29 goes to its most negative potential, which is determined by the diode 27 and the potential of the negative terminal of battery 28. Diode 27 and battery 28 constitute a means for limiting the negative swing of collector 31c.

The inverter circuits 6 and 7 serve as power amplifiers to reduce the load on the binary trigger 5 and thereby to increase the reliability and maximum operating frequency of the ring. When one of these inverters is conducting, it attempts to turn Off that half of the stages of the ring to which it is connected. If it is assumed that the trigger 5 and the inverters 6 and 7 switch instantaneously between their On and Off conditions, then at all times one of the inverters 6 and 7 is conducting and the other is cut off.

When inverter 6 is Off, the negative potential of its collector 31c is limited to −8 volts by battery 28 and diode 27. At that time, the collector 8c of the transistor 8 in the On stage (whose transistor 8 is Off) is similarly clamped by the same battery 28 through the diode 26. When the inverter 6 conducts, it raises the potential at terminal 29 to substantially 0 volts, this change in potential passes through the diode 26 of only that one stage which is On. In the Off stages, transistor 8 is On, and the diodes 26 are reversely biased, the On signal at terminal 29 serving merely to balance the potentials across the diodes 26 in those stages, thereby preventing transmission of a signal.

The inverters 6 and 7 differ from the standard inverter described in the Bruce and Henle application mentioned above, in that they have no individual load resistors, the only load on the inverter being the load of the Off transistor of whatever trigger is at the moment On. By virtue of this arrangement, the load requirements of the ring drive inverters do not change with the number of stages in the ring. The same inverter may be used with a 4-stage ring or with a 40-stage ring.

Referring to the inverters 6 and 7, it is in some instances desirable to include a large load resistor for each of those inverters, for convenience in servicing the circuits. If such a load resistor is used in connection with these inverters, it should be kept large, to maintain the current flow in it at a minimum, since such current serves no useful operating purpose.

Each of the capacity coupled inverters 56, 57, 58 and 59, used herein as interstage coupling inverters, uses a load resistor in common with the transistor 9 of its associated trigger. These inverters are biased Off. Input signals are received at the base 60*b* through a capacitor 64 connected to the collector of the transistor 9 in the preceding stage. When a collector 9 in one stage turns Off, it transmits a negative pulse from the capacitor 64 to the base of the next interstage couplings inverter, turning that inverter On for a sufficiently long time to raise the potential of its collector 60*c* to ground. This change in the collector potential is transmitted through cross-coupling resistor 19 and capacitor 20 of the following stage to the base of transistor 8*b*, where it is effective to turn the transistor 8 Off.

Note that the four interstage coupling inverters, 56, 57, 58 and 59 are connected in cascade. However, since they respond only to negative input potentials and produce positive output signals, a signal does not pass through them in a chain.

Consider that the stage 1 is in its On condition, so that the transistor 9 is On and transistor 8 is Off. Assume that a signal is then received from trigger circuit 5 through inverter 6 to the input terminal 30 of stage 1, which is connected through the diode 26 to collector electrode 8*c*. This signal is transmitted through cross-coupling resistor 21 and its parallel capacitor 22 to the base electrode 9*b* becoming effective to swing base electrode 9*b* positively and turn the transistor 9 Off. The resulting negative swing of the output potential of collector electrode 9*c* is transmitted through resistor 19 and capacitor 20 to base electrode 8*b*, where it is effective to turn the transistor On and thereafter to hold the potential of the collector electrode 8*c* at the value to which it was raised by the change of potential of terminal 30.

The transistor 9 in turning Off changes the potential of its collector electrode 9*c* in a negative sense, which change is transmitted through interstage coupling inverter circuit 57 to the collector electrode 9*c* of stage 2. Stage 2 is then in its Off condition with transistor 9 Off. This signal is inverted by the inverter circuit 57 so that it appears at control electrode 9*c* of stage 2 as a positive signal, which is transmitted through cross-coupling resistor 19 and capacitor 20 of stage 2 to base 8*b* where it becomes effective to cut off the transistor 8, thereby producing a change in the potential of collector electrode 8*c* of stage 2 in a positive sense. This change in potential is transmitted through coupling resistor 21 and capacitor 22 to the base electrode 9*b*, turning the transistor 9 On. Stage 2 has now been established in the same condition which stage 1 originally had, and stage 1 has been turned Off.

It should be noted that the inverter 6 has no load connected to its collector electrode 31*c* except for the load resistors 11 of the ring stages 1 and 3, and the battery 14. Note also that only one stage is On at a time. All the other stages are Off so that their transistors 8 are On and their collector electrodes 8*c* are positive, and are effective to bias the diodes 26 of their respective stages in the high impedance direction, so that only one stage at a time acts as a load on the inverter circuit 6. The use of the load resistors 11 of the several ring circuit stages as load resistors for driving the inverter simplifies the circuit and reduces the number of circuit elements required. It also speeds up the operation of the various switching actions by reducing the total load on the circuit.

The interstage coupling inverters 56, 57, 58 and 59 are also effective to speed up the switching action in the coupling between the stages. The transmission of the signals through the coupling inverter circuits takes place as soon as the transistor 9 switches and does not wait for the response of the transistor 8 before the signal is switched to the next successive ring stage. The speed of operation of the circuit is thereby greatly enhanced.

FIG. 2

This circuit illustrates an alternative arrangement for coupling between stages, which may be used in installations where the speed of the switching in the coupling operation is not of primary importance. The circuit of Fig. 2 does away with the interstage coupling inverters such as 56 in Fig. 1, and substitutes therefor a simple coupling including a capacitor 70 connected between the collector electrode 8*c* of stage 1 and the common junction 71 of two diodes 72 and 73 connected in series to the collector electrode 9*c* of stage 2. The diode 72 and a battery 74 connected in series with it serves as a clamp circuit for transistor 9 replacing the diode 23 and battery 25 of Fig. 1.

The circuit of Fig. 2 is considerably simpler than the inverter coupling arrangement of Fig. 1, since it substitutes a diode 73 for two resistors 61, 63 and a transistor 60 in the circuit of Fig. 1. It places more of a load on the preceding stage, which may result in a lower maximum operating frequency. However, since it operates directly from the drive signal, it eliminates the delay time between transistor 8 going On and transistor 9 going Off in the preceding stage. When the circuit is in use in a high speed computer where delays of the order of microseconds are considered to be of substantial importance, then the coupling arrangement of Fig. 1 should be used. Where a delay of that order is permissible, the coupling arrangement of Fig. 2 is entirely satisfactory.

The circuits disclosed use PNP junction transistors. It will readily be understood by those skilled in the art that NPN junction transistors may alternatively be employed, with corresponding changes in the polarities of the various batteries which are used, and other changes which are well understood by those skilled in the art.

The following table shows by way of example a particular set of values for the potentials of the various batteries and for the impedance of the various resistors and capacitors, in circuits which have been operated successfully. These values are set forth by way of example, only, and the invention is not limited to these values nor to any of them. No values are given for the asymmetric impedance elements which may be considered to have substantially no impedance in their forward direction and substantially infinite impedance in their reverse direction.

*Table I*

| | | |
|---|---|---|
| Resistor 11 | ohms | 10K |
| Resistor 12 | do | 10K |
| Battery 14 | volts | 45 |
| Resistor 15 | megohms | 1.0 |
| Resistor 16 | do | 1.0 |
| Battery 18 | volts | 45 |
| Resistor 19 | ohms | 27K |
| Capacitor 20 | mmf | 560 |
| Resistor 21 | ohms | 27K |
| Capacitor 22 | mmf | 560 |
| Battery 25 | volts | 8 |
| Battery 28 | do | 8 |
| Resistor 32 | megohms | 1.0 |
| Battery 33 | volts | 45 |
| Resistor 34 | ohms | 27K |
| Capacitor 35 | mmf | 560 |
| Resistor 40 | ohms | 10K |
| Resistor 41 | do | 10K |
| Resistor 42 | megohms | 1.0 |
| Resistor 43 | do | 1.0 |
| Battery 44 | volts | 45 |
| Capacitor 46 | mmf | 1000 |
| Capacitor 49 | do | 1000 |
| Resistor 50 | ohms | 27K |
| Capacitor 51 | mmf | 560 |
| Resistor 52 | ohms | 27K |
| Capacitor 53 | mmf | 560 |
| Resistor 54 | ohms | 3.3K |
| Resistor 55 | do | 3.3K |
| Resistor 61 | do | 470K |
| Resistor 63 | do | 10K |
| Capacitor 64 | mmf | 560 |
| Battery 67 | volts | 8 |
| Battery 69 | do | 8 |
| Capacitor 70 | mmf | 1000 |
| Battery 74 | volts | 8 |

While I have shown and described a preferred embodiment of my invention, other modifications thereof will readily occur to those skilled in the art, and I therefore intend my invention to be limited only by the appended claims.

I claim:

1. A ring circuit including a plurality of stages, each stage comprising first and second transistors, each stage having alternate On and Off output states and each having an input electrode and an output electrode, a pair of cross-coupling means, each coupling the output electrode of one transistor to the input electrode of the other and effective when one transistor is Off to hold the other On, said first transistor being normally On, and load means connected to the output electrode of said transistors, at least one driving inverter circuit, for transmitting driving impulses to a plurality of said stages, said inverter circuit comprising a transistor having an input electrode and an output electrode, a plurality of diodes, each connected between the output electrode of said inverter transistor and the output electrode of one of said first transistors, the first transistor of only one of said stages being Off at one time, the load means for all said first transistors being the only load connected to said inverter transistor output electrode, said diodes effectively isolating from the inverter transistor all said load circuit means except the load circuit means of the one of said first transistors which is Off, one of said cross-coupling means being effective, when one of said inverter circuits transmits a driving impulse to the one of said first transistors which is Off, to transmit said impulse to the input electrode of the second transistor of the associated stage in a sense to turn said transistor Off, the other cross-coupling means of said stage being thereupon effective to transmit to the input electrode of said first transistor an impulse effective to turn said first transistor On, and coupling means connecting each stage to the next succeeding stage and effective when the transistors of one stage shift from their abnormal output states to their normal states to transmit to said succeeding stage a signal impulse effective to shift the transistors thereof from their normal output states to their opposite output states.

2. A ring circuit as defined in claim 1, including clamping circuits for each of said transistors, the clamping circuits for said transistor comprising a second diode connected in series with said first-mentioned diode, and a clamping battery in series with said second diode.

3. A ring circuit as defined in claim 1, including for the second transistor of each stage, clamping means connected to the output electrode thereof including in series a source of unidirectional electrical potential and two diodes.

4. A ring circuit as defined in claim 1, in which the coupling means between each pair of successive stages comprises an inverter including a transistor having an input electrode and an output electrode, means coupling the output electrode of the second transistor of the preceding stage to the input terminal of the inverter transistor, and means connecting the output terminal of the inverter transistor to the output terminal of the second transistor of the succeeding stage.

5. A ring circuit as defined in claim 4, in which said means coupling the output electrode of each second transistor to the input terminal of the inverter transistor comprises a capacitor.

6. A ring circuit as defined in claim 4 in which said inverter and said second transistor have a common load.

7. A ring circuit including an even number of stages, each stage comprising first and second transistors having alternate On and Off output states and each having an input electrode and an output electrode, a pair of cross-coupling means, each coupling the output electrode of one transistor to the input electrode of the other and effective when one transistor is Off to hold the other On, said first transistor being normally On, and load means connected to the output electrodes of said transistors, a pair of driving inverter circuits, for transmitting driving impulses to said stages, one inverter circuit for the odd stages and one for the even stages, each inverter circuit comprising a transistor having an input electrode and an output electrode, a plurality of diodes, each connected between the output electrode of one of said inverter transistors and the output electrode of said first transistors, only one of said first transistors being Off at one time, the load means for said first transistors being the only load connected to said inverter transistors, said diodes effectively isolating from each inverter transistor all said load means except the load means of said first transistors which is Off, one of said cross-coupling means being effective, when one of said inverter circuits transmits a driving impulse to the one of said first transistors which is Off, to transmit said impulse to the input electrode of the second transistor of the associated stage in a sense to turn said second transistor Off, the other cross-coupling means of said stage being thereupon effective to transmit to the input electrode of said first transistor an impulse effective to turn said first transistor On, and coupling means connecting each stage to the next succeeding stage and effective when the transistors of one stage shift from their abnormal output states to their normal output states to transmit to said succeeding stage a signal impulse effective to shift the transistors thereof from their normal output states to their alternate output states.

8. A ring circuit including a plurality of stages, each stage comprising first and second transistors having alternate On and Off output states and each having an input electrode and an output electrode, a pair of cross-coupling means, each coupling the output electrode of one transistor to the input electrode of the other and effective when said one transistor is On to hold the other Off, said first transistor being normally On, and load means connected to the output electrodes of said transistors, at least one driving inverter circuit, for transmitting driving impulses to a plurality of said stages, said inverter circuit comprising a transistor having an input electrode and an output electrode, a plurality of diodes, each connected between the output electrode of said inverter transistor and the output electrode of one of said first transistors, only one of said first transistors being Off at one time, the load means for said first transistors being the only load connected to said inverter transistor, said diodes effectively isolating from the inverter transistor all said load means except the load means of the one of said first transistors which is Off, one of said cross-coupling means being effective, when one of said inverter circuits transmits a driving impulse to the one of said first transistors which is Off, to transmit said impulse to the input electrode of the second transistor of the associated stage in a sense to turn said second transistor Off, the other cross-coupling means of said stage being thereupon effective to transmit to the input electrode of said first transistor an impulse effective to turn said first transistor On, and coupling means between stages comprising an inverter circuit connecting the output electrodes of the normally Off transistors in successive stages.

References Cited in the file of this patent

UNITED STATES PATENTS

| | | |
|---|---|---|
| 2,536,916 | Dickinson | Jan. 2, 1951 |
| 2,569,345 | Shea | Sept. 25, 1951 |
| 2,580,771 | Harper | Jan. 1, 1952 |
| 2,591,961 | Moore | Apr. 8, 1952 |
| 2,665,845 | Trent | Jan. 12, 1954 |
| 2,673,936 | Harris | Mar. 30, 1954 |
| 2,722,630 | Branch | Nov. 1, 1955 |
| 2,734,684 | Ross et al. | Feb. 14, 1956 |
| 2,771,551 | Hampton | Nov. 20, 1956 |
| 2,785,304 | Bruce et al. | Mar. 12, 1957 |